United States Patent [19]

Watanabe et al.

[11] 4,177,872

[45] Dec. 11, 1979

[54] SPEAKER SYSTEM

[75] Inventors: Shinichi Watanabe, Matsudo; Shigeru Okazaki, Tokyo; Mamoru Osata, Yokohama, all of Japan

[73] Assignee: Sony Corporation, Tokyo, Japan

[21] Appl. No.: 882,260

[22] Filed: Feb. 28, 1978

[30] Foreign Application Priority Data

Mar. 11, 1977 [JP] Japan ............................ 52-29404[U]

[51] Int. Cl.$^2$ ........................ H05K 5/00; G10K 13/00

[52] U.S. Cl. .................................... 181/144; 181/148; 181/147; 181/171

[58] Field of Search ............... 181/144, 147, 148, 157, 181/171, 145

[56] References Cited

U.S. PATENT DOCUMENTS

| | | | |
|---|---|---|---|
| 2,031,859 | 2/1936 | Schajira | 181/171 |
| 2,171,940 | 9/1939 | MacNabb | 181/148 |
| 2,198,243 | 4/1940 | Bussard | 181/171 |
| 2,217,279 | 10/1940 | Karns | 181/147 |
| 3,291,251 | 12/1966 | Zemrowski | 181/147 |
| 3,754,618 | 8/1973 | Sasaki | 181/145 |
| 3,861,495 | 1/1975 | Pearson | 181/157 |

*Primary Examiner*—Stephen J. Tomsky
*Attorney, Agent, or Firm*—Hill, Van Santen, Steadman, Chiara & Simpson

[57] ABSTRACT

A speaker system employs: a baffle board in front of a cabinet made of wood, with a woofer mounted on the baffle board; and a sub-baffle board having a medium-range speaker and a tweeter mounted thereon. The sub-baffle board comprises a metal board and a damping plate such as a rubber plate laminated on the metal plate.

2 Claims, 3 Drawing Figures

SPEAKER SYSTEM

BACKGROUND OF THE INVENTION

1. Field of the Invention

This invention relates to a speaker system, and more particularly to a novel baffle board having a plurality of speakers mounted thereon.

2. Description of the Prior Art

A speaker system is known, in which a single speaker is housed in a cabinet so as to reproduce an aural signal of an audio frequency band by the speaker. In general, such a speaker system is small in the size and employs a single speaker, so that the speaker system of this type is reasonable for use as a sounds source because of the use of a single speaker. However, this speaker system suffers from a difficulty in high-fidelity sound reproduction for sound covering from a low to a high range. To cope with this, it has been a general practice to adopt a speaker system, in which sounds of a low range, medium range, and high range may be reproduced by individual speakers, respectively. This system allows high fidelity sound reproduction. However, since the speakers are independently mounted on a baffle board of a cabinet, there arises a shortcoming in that, high and low sounds are reproduced from separate portions, despite the fact that a single sound source is used. This shortcoming may be avoided by positioning speakers responsible for respective sound ranges, as close to each other as possible. However, the cabinet used at the present time widely are made of wood, so that when respective speakers are positioned close to each other, the mechanical strength of such a portion of the cabinet, which supports speakers thereon, is likely to be lowered. Accordingly, it has been a common practice to attach to a baffle board a woofer, medium-range speaker and tweeters at such a spacing as to maintain a desired minimum mechanical strength of a baffle board. It follows from this that low and high sounds are reproduced from the mutually separated or spaced portions, as has been described earlier.

SUMMARY OF THE INVENTION

It is accordingly an object of the present invention to provide a speaker system which may reproduce Hi-Fi sounds.

It is another object of the present invention to provide a speaker system, in which a two or more speakers are positioned close to one another, so as to produce a seemingly single sound source of sound waves from low to high range.

It is further object of the present invention to provide a speaker system, in which two or more speakers are positioned in the close vicinity of one another, while maintaining a desired mechanical positional density of a baffle board.

It is a still further object of the present invention to provide a speaker system, in which a metallic sub-baffle board is attached to a wooden baffle board, on which is attached a woofer, and then a medium range speaker and tweeters are mounted on the sub-baffle board, thereby allowing the reproduction of high sound at no sacrifice of a desired acoustic characteristic of a wooden cabinet.

It is a yet further object of the present invention to provide a speaker system which is equipped with a metallic baffle board having a medium range speaker and tweeters mounted thereon, and a damping plate adapted to reduce the resonance sharpness of the metallic baffle, thereby preventing resonance at a specific frequency.

It is a further object of the present invention to provide a speaker system, in which at least a medium range speaker and tweeters are accurately rigidly mounted on a baffle board, so that an attaching dimensional error or the production of uncomfortable sounds may be prevented during its service.

It is a further object of the present invention to provide a speaker system, in which a medium range speaker, and tweeters may be attached to a baffle board intimately closely.

These and other objects, features and advantages of the invention will appear more fully from the following description given in conjunction with the accompanying drawings which indicate an embodiment of the invention.

DETAILED DESCRIPTION OF PREFERRED EMBODIMENTS

Figure 1:
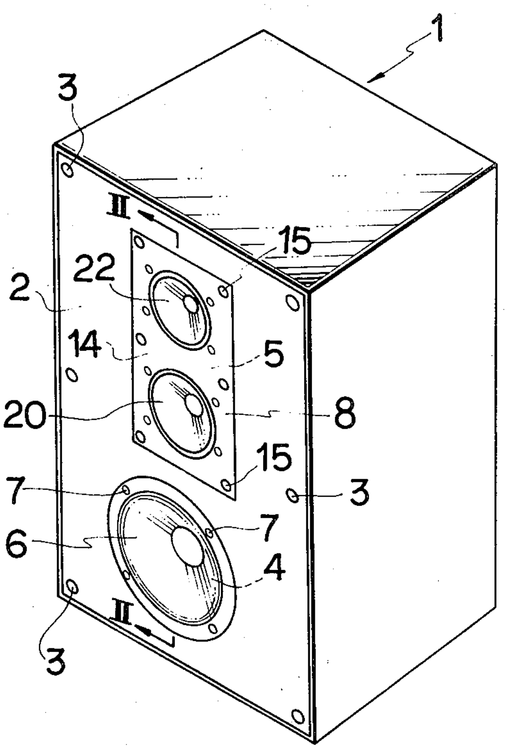
FIG. 1 is a perspective view of a speaker system according to this invention.

Referring now to FIG. 1, a wooden cabinet 1 includes a wooden baffle board 2 on its front surface.

Figure 2:
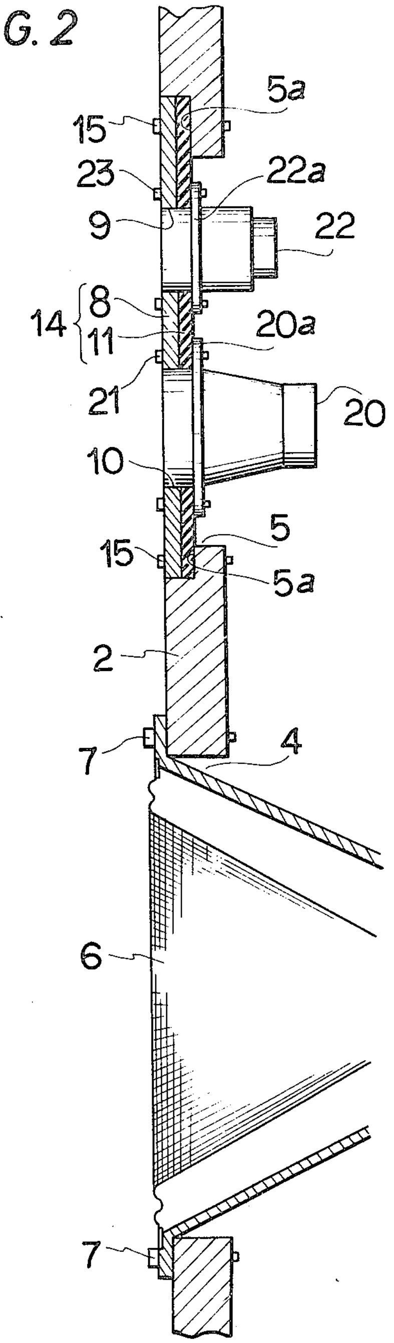
FIG. 2 is an enlarged sectional view taken along vertical line II—II of FIG. 1.

The baffle board 2 is secured to the cabinet 1 by means of two or more screws 3, and, as shown in FIG. 2, formed with a circular opening 4 in its lower portion, and a rectangular opening 5 in its upper portion in the close vicinity of the opening 4.

A woofer 6 is secured to the baffle board 2 by means of two or more screws 7 from internally of the cabinet 1 in opposed relation to or in a manner to cover the opening 4. As a result, reproduced sound of a low range from the woofer 6 may emerge to the exterior of the cabinet through the opening 4. Meanwhile, the procedure and arrangement to attach the woofer 6 to the baffle board are not limitative to this instance. A board 8 made of metal is positively held in the opening 5 for the sounds of medium and high pitch tone ranges. More particularly, the board 8, for instance, is made of aluminum, aluminum alloy, iron, and other suitable metal, while openings 9,10 are positioned above and below the board 8, respectively.

The board 8 is further provided with a damping plate 11 on its back. The damping plate 11 is made of, such as, rubber, cork or the like, and substantially of the same shape as that of the board 8 (FIG. 3), and formed with openings 12,13 which are positioned in register with the openings 9,10 provided in the board 8. The damping plate 11 is secured to the board 8 with the aid of a bonding agent, with the result that the board 8 and damping plate 11 constitute a single sub-baffle board 14.

With the sub-baffle board 14 thus arranged, the damping plate is fitted on a shoulder portion 5*a* defining part of the opening 5 provided in the baffle board 2 in a manner to position the damping plate 11 internally of the cabinet, and rigidly secured to the baffle board 2 by means of two or more screws 15. In this respect, the damping plate 11 is interposed between the board 8 and the baffle board 2, so that the interior of the cabinet 1 may be maintained in a desired air-tight condition by means of the plate 11. Meanwhile, as shown in FIG. 3, two or more holes 16,17 provided in the board 8 and plate 11, respectively, serve to admit the screws 15 therethrough.

The medium range speaker 2 includes a frame 20*a* which is secured to the sub-baffle board 14 by means of screws from internally of the cabinet 1 in opposed relation to the openings 10,13. Likewise, the tweeter 22 includes a frame 22*a*, which is secured to the sub-baffle board 14 by means of screws 24 from internally of the cabinet 1 in opposed relation to the openings 9,12. In this case, the speakers 20,22 are attached to the board 8 through the medium of the damping plate 11 in air-tight relation. As is clear from FIG. 1, the woofer, medium range speaker, and tweeters 6,20,22 are positioned on the baffle board 2 along a line in the vertical direction.

Figure 3:
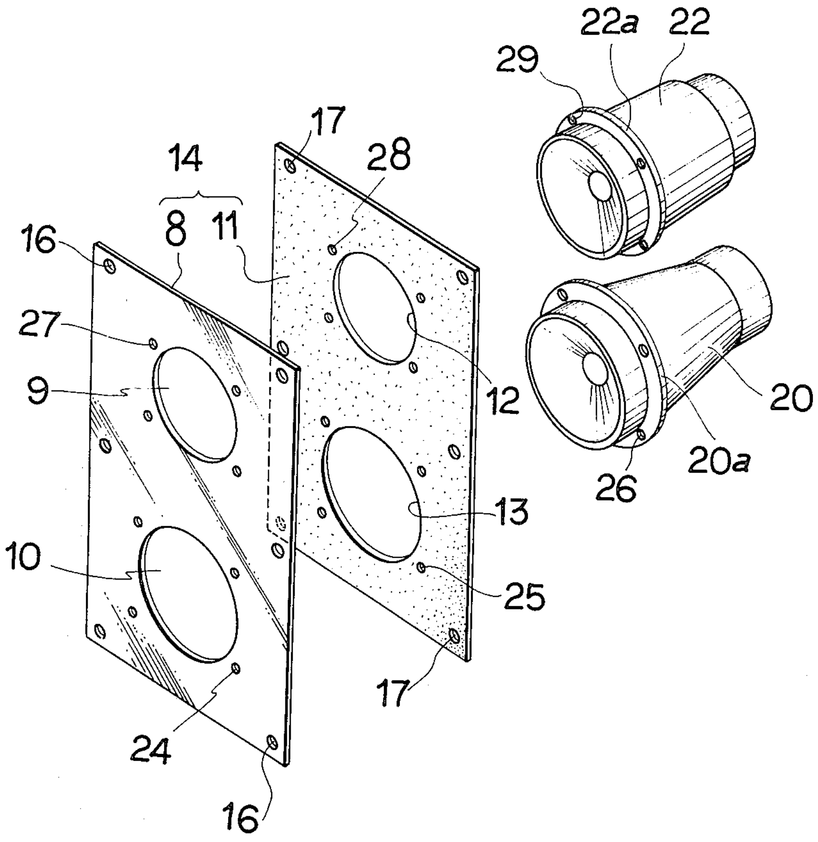
FIG. 3 is a perspective view of a sub-baffle board mounting speakers thereon according to the invention.

Meanwhile, the openings 24,25,26,27,28,29 serve, as shown in FIG. 3, as through-holes to admit screws 21,23 therein.

As is apparent from the foregoing description of the present invention, the speaker system includes the board 8 which is made of a metal, so that the speaker system according to the present invention affords high rigidity and allows the provision of the speakers 20,22 in the close vicinity to each other, thereby providing sound waves approximating natural sound waves. In addition, the damping plate covers the entire surface of the board 8 on its one side, with the result that, even if vibrations tending to produce abnormal sounds are transmitted to the board 8, the damping plate 11 may function so as to suppress the vibrations. Accordingly, there may be achieved a baffle board affording an excellent damping effect.

Furthermore, the damping plate 11 is used as a packing for common use with the speakers 20,22, so that packings need not be provided for speakers additionally. Still furthermore, the damping plate serves as a packing for common use with the board 8 and baffle board 2, thus facilitating to maintain an air-tight condition for the cabinet 1. Yet, furthermore, since the board 8 is made of a metal, respective speakers may be secured thereto in proper position accurately.

What we claimed is:

1. A speaker system comprising a cabinet;
   - a baffle board mounted in front of said cabinet and having first and second openings;
   - a woofer mounted on said baffle board so as to cover said first opening;
   - a sub-baffle board mounted on said baffle board so as to cover said second opening, said sub-baffle board having two openings, said sub-baffle board including a metal board and a damping plate laminated on said metal board;
   - a medium range speaker mounted on said sub-baffle board through said damping plate so as to cover one of said openings in said sub-baffle board; and
   - a tweeter mounted on said sub-baffle board through the medium of said damping plate so as to cover the other of said openings in said sub-baffle board.

2. A speaker system as claimed in claim 1, wherein said metal board is mounted on said baffle board through the medium of said damping plate.

* * * * *